(12) United States Patent
Zhu et al.

(10) Patent No.: US 11,736,005 B2
(45) Date of Patent: Aug. 22, 2023

(54) SWITCHED CAPACITOR CONVERTER

(71) Applicant: NXP B.V., Eindhoven (NL)

(72) Inventors: Dongyong Zhu, Shanghai (CN); Bo Cai, Shanghai (CN); XinDong Duan, Shanghai (CN); Feng Cong, Shanghai (CN); Jian Qing, Shanghai (CN)

(73) Assignee: NXP B.V., Eindhoven (NL)

( * ) Notice: Subject to any disclaimer, the term of this patent is extended or adjusted under 35 U.S.C. 154(b) by 119 days.

(21) Appl. No.: 17/443,972

(22) Filed: Jul. 29, 2021

(65) Prior Publication Data

US 2022/0385179 A1    Dec. 1, 2022

(30) Foreign Application Priority Data

May 27, 2021    (CN) .......................... 202110587999.4

(51) Int. Cl.
*H02M 3/07* (2006.01)
*H02M 1/08* (2006.01)
*H02M 3/158* (2006.01)

(52) U.S. Cl.
CPC ............. *H02M 3/07* (2013.01); *H02M 1/08* (2013.01); *H02M 3/158* (2013.01)

(58) Field of Classification Search
CPC ........... H02M 1/08; H02M 3/07; H02M 3/158
See application file for complete search history.

(56) References Cited

U.S. PATENT DOCUMENTS

| | | | |
|---|---|---|---|
| 6,744,303 B1 | 6/2004 | Maley | |
| 7,446,549 B2 | 11/2008 | Tomita et al. | |
| 7,994,827 B2 | 8/2011 | Williams | |
| 9,722,593 B2 | 8/2017 | Berkhout et al. | |
| 9,960,755 B2 | 5/2018 | Mengad | |
| 10,594,210 B1 | 3/2020 | Mercer et al. | |
| 10,826,482 B1 | 11/2020 | Kwok et al. | |
| 2005/0035410 A1 | 2/2005 | Yeo et al. | |
| 2008/0237673 A1 | 10/2008 | Wada et al. | |

(Continued)

FOREIGN PATENT DOCUMENTS

CN    201515362 U    6/2010

OTHER PUBLICATIONS

NXP; "PCA9481AUK 10 A 2:1/1:2/1:1 mode switched capacitor direct charger" Rev. 1.0; Aug. 23, 2022 Product short data sheet; 6 pages.

(Continued)

*Primary Examiner* — Alex Torres-Rivera (57) ABSTRACT

The disclosure relates to a switched capacitor converter (SCC) with gate driving circuits for limiting currents provided by switching field effect transistors. Embodiments disclosed include an SCC with gate driver curcuits providing gate voltage signals to power FETs, each gate driver circuit comprising first and second gate driver modules and configured to operate in: a first mode in which the first gate driver module provides a gate voltage signal to a power FET that switches between first and second voltage rails by operation of first and second switches connected between the pair of voltage rails; and a second mode in which, in reponse to enabling of a current limit switching signal, the first gate driver module disables switching of one of the first and second switches and the second gate driver module operates to limit a current provided to the power FET.

20 Claims, 4 Drawing Sheets

(56) References Cited

U.S. PATENT DOCUMENTS

| | | | |
|---|---|---|---|
| 2010/0226166 A1 | 9/2010 | Jung et al. | |
| 2014/0300413 A1* | 10/2014 | Hoyerby | H02M 1/08 |
| | | | 327/109 |
| 2021/0257907 A1* | 8/2021 | Lai | H02M 1/08 |
| 2022/0131456 A1* | 4/2022 | Lai | H02M 1/36 |

OTHER PUBLICATIONS

NXP; "PCA9482UK 7 A 2:1, 1:2, and 1:1 mode switched capacitor direct charger" Rev. 1.0; Nov. 8, 2022 Short data sheet; 6 pages.
U.S. Appl. No. 17/807,869, filed Jun. 21, 2022 (22 pages).

\* cited by examiner

SWITCHED CAPACITOR CONVERTER

CROSS-REFERENCE TO RELATED APPLICATIONS

This application claims the priority under 35 U.S.C. § 119 of Chinese patent application no. 202110587999.4, filed on May 27, 2021, the contents of which are incorporated by reference herein.

FIELD

The disclosure relates to a switched capacitor converter with gate driving circuits for limiting currents provided by switching field effect transistors.

BACKGROUND

Switched capacitor converters (SCCs) can be used to convert between different DC voltage supply levels using capacitors and semiconductor switches arranged between an input DC supply and an output DC supply. SCCs can be used as alternatives to switched inductor converters (SICs) and can be advantageous due to improved on-die integration, lower electromagnetic interference, high conversion efficiency, high current and power capability and lower cost. SCCs may be preferable in low cost, low power applications, particular in battery-powered applications.

In an SCC, fast switching gate driver circuitry is required to drive power FETs in a ladder arrangement in different operational modes to achieve the required voltage output and efficiency. In high voltage operation, the supply voltage may be higher than a maximum allowed gate voltage of the FETs, requiring the gate voltage of each FET to be carefully controlled, particularly during a startup phase of an SCC, to avoid exceeding the maximum gate voltage for each FET.

In U.S. Pat. No. 10,826,482 B1, a voltage level is controlled for FET floating gates in an SCC circuit by applying energy to the FET gates in pulses comprising an initial energy pulse and successive adjusting pulses until each gate reaches a target operating voltage in a nominal operating range.

SUMMARY

According to a first aspect there is provided a switched capacitor converter, SCC, comprising:
 a first capacitor;
 a plurality of power field effect transistors, FETs, connected in a ladder arrangement between an input voltage node and a ground voltage node, the plurality of power FETs operable to charge and discharge the first capacitor; and
 a plurality of gate driver circuits, a gate of each power FET connected to an output of a respective gate driver circuit, each gate driver circuit connected to first and second supply voltage rails and arranged to provide a gate voltage signal to a respective power FET in response to a respective input switching signal,
 wherein each gate driver circuit comprises a first gate driver module and a second gate driver module, the gate driver circuit being configured to operate in:
 a first mode in which the first gate driver module provides the gate voltage signal to a respective power FET in response to an input switching signal at an input of the first gate driver module causing the gate voltage signal to switch between the first and second voltage rails by operation of first and second switches connected between the pair of voltage rails; and
 a second mode in which, in response to enabling of a current limit switching signal, the first gate driver module disables switching of one of the first and second switches and the second gate driver module operates to limit a current provided to the respective power FET.

The SCC is able to operate in the first mode during normal operation, i.e. when each of the gate driving circuits is driving a respective power FET through a full voltage range and in the second mode during a startup phase where current being supplied to charge the capacitors.

The first gate driver module may comprises a logic circuit configured to convert the input switching signal to a pair of switching signals provided to respective first and second inverters connected to respectively drive the first and second switches.

The first switch may be a p-channel FET and the second switch an n-channel FET, a node between the first and second switches connected to the gate of the respective power FET.

The second gate driver module may comprises a amplifier with a first input connected to a reference voltage circuit and a second input connected to the gate of the respective power FET, the reference voltage circuit comprising a current source in series with a first diode-connected n-channel FET connected between the pair of supply voltage rails, the input of the amplifier connected to a node between the current source and the first diode-connected n-channel FET.

The second gate driver module may comprise a second diode-connected n-channel FET connected between an output of the amplifier and the second supply voltage rail via a third switch.

The logic circuit may be configured to provide an internal switching signal to the second diode-connected n-channel FET to connect the second diode-connected n-channel FET to the second supply voltage rail (202) when the switching signal is enabled. The internal switching signal, IN_int, may be a logical combination of the input switching signal, IN, and the current limiting signal, climit_en. The logical combination may be IN_int=NOT(IN) AND NOT(climit_en).

The second gate driver module may comprise a third n-channel FET having a drain connected to the first supply voltage rail, a gate connected to the output of the amplifier and a drain connected to the second voltage supply rail via a resistor and a fourth switch, the fourth switch arranged to close on enabling of the current limit switching signal.

The second gate driver module may comprise a drain voltage sensing circuit connected between the first input of the amplifier and the second voltage supply rail, the drain voltage sensing circuit comprising a voltage sensing module configured to measure a drain voltage of the respective power FET and a plurality of switches connected in parallel between the first input of the amplifier and the second voltage supply rail, the voltage sensing module configured to progressively close the plurality of switches as the drain voltage rises.

The plurality of power FETs may comprise first, second, third and fourth power FETs, wherein:
 the first power FET has a source connected to the ground voltage node and a drain connected to a source of the second power FET and to a first terminal of the first capacitor;
 the second power FET has a drain connected to an output voltage node and to a source of the third FET;

the third power FET has a drain connected to a source of the fourth FET and to a node connecting a second terminal of the first capacitor and a first terminal of a second capacitor; and the fourth power FET has a drain connected to a supply voltage node.

The plurality of gate driver circuits may comprise first, second, third and fourth gate driver circuits having respective first, second third and fourth switching signal inputs and respective outputs connected to gates of the first, second, third and fourth power FETs.

In example implementations of the SCC:

a first voltage rail of the first gate driver circuit is connected to the output voltage node and a second voltage rail of the first gate driver circuit is connected to the ground voltage node;

a first voltage rail of the second gate driver circuit is connected to the node connecting the second terminal of the first capacitor and the first terminal of the second capacitor and a second voltage rail of the second gate driver circuit is connected to the first terminal of the first capacitor;

a first voltage rail of the third gate driver circuit is connected to the input voltage node and a second voltage rail of the third gate driver circuit is connected to the output voltage node; and a first voltage rail of the fourth gate driver circuit is connected to a second terminal of the second capacitor and a second voltage rail of the fourth gate driver circuit is connected to the node connecting the second terminal of the first capacitor and the first terminal of the second capacitor.

In accordance with a second aspect of the invention there is provided a method of operating the SCC according to the first aspect, the method comprising:

in a first time period, disabling the current limit switching signal and providing the input switching signal to each of the gate driver circuits to generate a gate voltage switching between the first and second voltage rails to each respective power FET; and in a second time period, enabling the current limit switching signal and providing the input switching signal to each of the gate driver circuits to generate a reduced gate voltage switching to each respective power FET.

The first time period corresponds to the SCC in a normal operational mode, while the second time period corresponds to the SCC operating in a startup mode in which current for charging the capacitors is limited by enabling the current limit switching signal.

The method may comprise:

in a third time period, enabling the current limit switching signal and providing a constant input signal to each of the gate driver circuits to generate a constant gate voltage to each respective power FET.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

Figure 1:
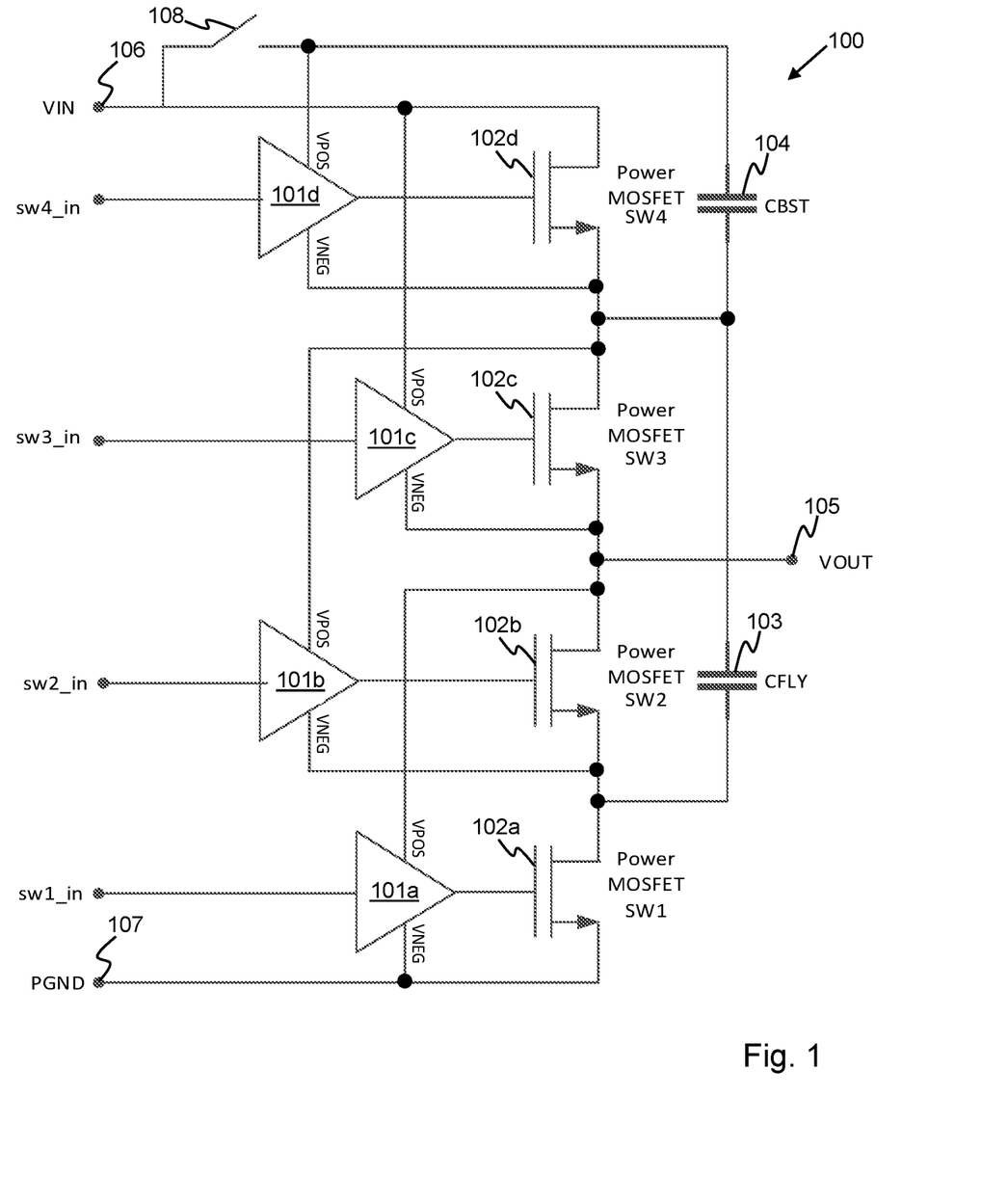
FIG. 1 is a schematic circuit diagram of a switched capacitor converter.

FIG. 1 illustrates an example SCC 100 having gate drivers 101a-d arranged to drive respective n-channel power MOSFET switches SW1-SW4 102a-d connected in a ladder arrangement between an input voltage VIN node 106 and a ground voltage PGND node 107. The sources and drains of the FETs 102a-d are connected in series between the ground connection 107 and the supply voltage connection 106. The source of a first FET 102a is connected to PGND and the drain is connected to the source of a second FET 102b and to a first terminal of a first capacitor CFLY 103. The drain of the second FET 102b is connected to an output voltage VOUT node 105 and to the source of a third FET 102c. The drain of the third FET 102c is connected to the source of a fourth FET 102d, to a first terminal of a second capacitor CBST 104 and to a second terminal of the first capacitor CFLY 103. The drain of the fourth FET 102d is connected to the supply voltage VIN. The supply voltage VIN is converted to an output voltage VOUT by controlled switching of FETs 102a-d, which operate to charge and discharge the first capacitors CFLY 103. The supply voltage VIN may for example by 10 V and the output voltage $V_{OUT}$ 5 V, i.e. with an input:output ratio of 2:1.

Each gate driver 101a-d is provided with a supply voltage according to the connections to its VPOS and VNEG supply terminals. The first gate driver 101a is supplied by $V_{OUT}$-$V_{PGND}$. The second gate driver 101b is supplied by $V_{CFLY}$, i.e. the voltage across the first capacitor $C_{FLY}$. The third gate driver 101c is supplied by $V_{IN}$-$V_{OUT}$. The fourth gate driver 101d is supplied by $V_{CBST}$, i.e. the voltage across capacitor $C_{BST}$.

The arrangement in FIG. 1 is similar to that of U.S. Pat. No. 10,826,482 B1, in which a closed-loop voltage limiting scheme is used to limit the gate-source voltage for each FET to a programmable level, or a programmable current-mirror bias voltage to limit switching current during an initial soft-start.

During a normal operating mode, in a first phase power FETs SW1 and SW3 are switched fully on, creating a current path from PGND through SW1, CFLY and SW3 to VOUT. In a second phase, FETs SW2 and SW4 are fully on, creating a path from VIN through SW4, CFLY and SW2 to VOUT. The voltage conversion therefore relies on charging and discharging the capacitor CFLY using the four power FETs.

The second capacitor CBST is a bootstrap capacitor that, when switch 108 is closed, is connected to VIN, which helps to generate the supply voltage for the gate driver circuitry 101d for FET SW4. The switch 108 is therefore needed during a startup operation to provide an initial charge across CBST and to supply the VPOS supply to the gate driver circuit 101d.

In a normal operating mode, the supply voltage for each gate driver 102a-d is valid and the correct ratio for $V_{IN}$:

$V_{OUT}$ (e.g. 2:1) is provided with a proper current load. However, upon startup of the circuit 100 the supply for gate drivers 101b -d is not yet valid. Capacitor CFLY 103, which may have a large value, for example in the μF level, will need to be pre-charged with a controlled current for a time to avoid a large inrush current. Once the voltage $V_{CFLY}$ across the first capacitor $C_{FLY}$ 103 has reached a sufficient level, the first and second gate drivers 101a, 101b will have a proper supply voltage. Before switching the FETs over a full range, in which FETs 102a, 102c are fully on and FETs 102b, 102d fully off in a first phase and FETs 102a, 102c are fully off and FETs 102b, 102d fully on in a second phase as described above, the circuit 100 needs to operate in a partial switching mode in which FETs 102a, 102b are switched within a limited range to avoid an inrush current.

Figure 2:
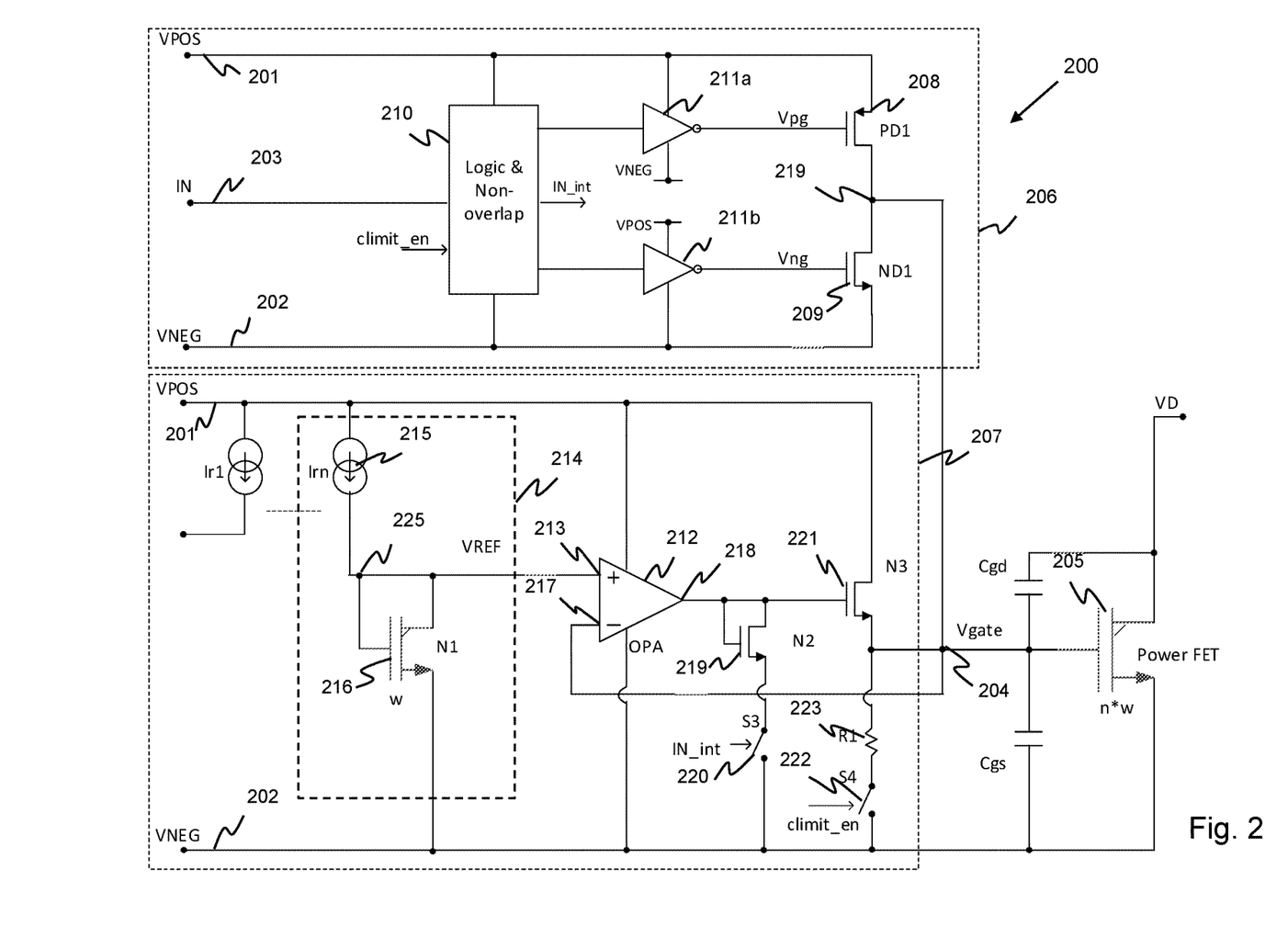
FIG. 2 is a schematic circuit diagram of a gate driver circuit for the switched capacitor converter of FIG. 1.

FIG. 2 illustrates a gate driver circuit 200 for use as any of the gate drivers 102a-d in the circuit of FIG. 1. The circuit 200 is powered with supply rails VPOS 201 and VNEG 202, connected as shown in FIG. 1, and with an input connection IN 203 corresponding to the sw1_in, sw2_in, sw3_in and sw4_in connections in FIG. 1. A Vgate output 204 is provided to a power FET 205, corresponding to one of the FETs 102a-d in FIG. 1. Gate-drain and gate-source capacitances Cgd, Cgs that are part of the FET 204 are indicated in FIG. 2 as separate components.

The gate driver circuit 200 comprises first and second gate driver modules 206, 207. The first gate driver module 206 is configured to generate a full swing gate drive signal for use in normal operation, i.e. a signal that varies between VPOS and VNEG when the circuit is stabilised after startup. The second gate driver module 207 is configured to generate a limited swing gate drive signal for use during startup of the SCC 100. The first gate driver module 206 comprises a pull up device PD1 and a pull down device ND1 in the form of a p-channel FET 208 and n-channel FET 209 connected in series between the VPOS rail 201 and VNEG rail 202. A node 219 between the devices 208, 209 is connected to the Vgate output 204. Gate switching signals to each device 208, 209 are provided from the input signal IN via a logic circuit 210 and inverters 211a, 211b, the logic circuit 210 configured to convert the input signal IN to a pair of signals provided to a first inverter 211 driving the gate of the p-channel FET 208 and a second inverter 211 driving the gate of the n-channel FET 209. The logic circuit 210 also receives a first switching signal climit_en that controls whether the first gate driver module 206 provides signals to devices 208, 209. When climit_en is high, current limitation is enabled for the circuit 200 and when climit_en is low the circuit 200 operates in a normal mode.

The logic circuit 210 is also configured to provide an internal switching signal IN_int that is enabled when first switching signal climit_en is enabled, i.e. is a logical combination of the signals IN and climit_en. The first and second switching signals climit_en, IN_int are provided to the second gate switching module 207 to operate the current limitation mode.

The second gate switching module 207 is configured to provide a limited switching signal to the output 204 when the first switching signal climit_en is enabled, i.e. when the SCC 100 is in a startup mode. In the startup mode, the output voltage Vgate at the output 204 switches over a reduced range to prevent a high inrush current when charging capacitor CFLY 103. Once the startup mode finishes and the climit_en signal is disabled, the IN_int signal is enabled and the output 204 is switched over the full range as the SCC 100 operates in normal mode.

The second gate switching module 207 comprises an amplifier 212 with a first input 213 connected to a reference voltage circuit 214 and a second input 217 connected to the output 204 of the gate driver circuit 200. The reference voltage circuit 214 comprises a current source 215 in series with a first diode-connected n-channel FET N1 216 connected between the supply rails 201, 202, the input 213 of the amplifier 212 being connected to a node 225 between the current source 215 and the FET 216. The current source 215 provides a fixed current Irn to provide a stable reference voltage VREF at the first input 213 of the amplifier 212. The amplifier 212 compares the reference voltage VREF to the voltage at the output 204 and provides an output signal at output 218 to second and third n-channel FETs N2 219 and N3 221. Second FET 219 is a diode-connected FET connected between the amplifier output 218 and VNEG 202 via a first switch S3 220. The switch S3 220 is operated by the internal switching signal IN_int, which closes the switch 220 when the signal IN_int is enabled, connecting the source of FET 219 to VNEG 202. The third FET 221 is connected between the supply rails 201, 202 with its gate connected to the amplifier output 218, its drain connected to VPOS rail 201 and source connected to VNEG 202 via a resistor 223 in series with a second switch 222. The second switch 222 is operated by the first switching signal climit_en, which closes the second switch 222 when the signal climit_en is enabled, connecting the source of FET 221 to VNEG 202 via resistor 223.

The first switching gate driver 206 operates to drive the power FET 205 to switch over the full supply range during normal operation to efficiently drive the SCC 100. To limit the current supplied to the power FET 205 in the limited switching mode, i.e. when climit_en is enabled, FET PD1 208 is in a fully-off state, FET ND1 209 is either fully on or off and FET N3 221 is either fully off or on. During switching of the input signal IN when climit_en is enabled, the first switch S3 220 may also be closed or open to disable or release FET N3 221. When the source follower FET N3 221 is on, the output voltage Vgate can be charged to a dedicated level to turn on the power FET 205. The gate voltage Vgate is clamped by the source follower and the closed loop.

For a fixed reference current Irn, the output voltage Vgate can follow the reference voltage VREF in real time and the power FET 205 has the current mirrored from the first FET N1 216 with the ratio n. This results in the required limited current.

Figure 3:
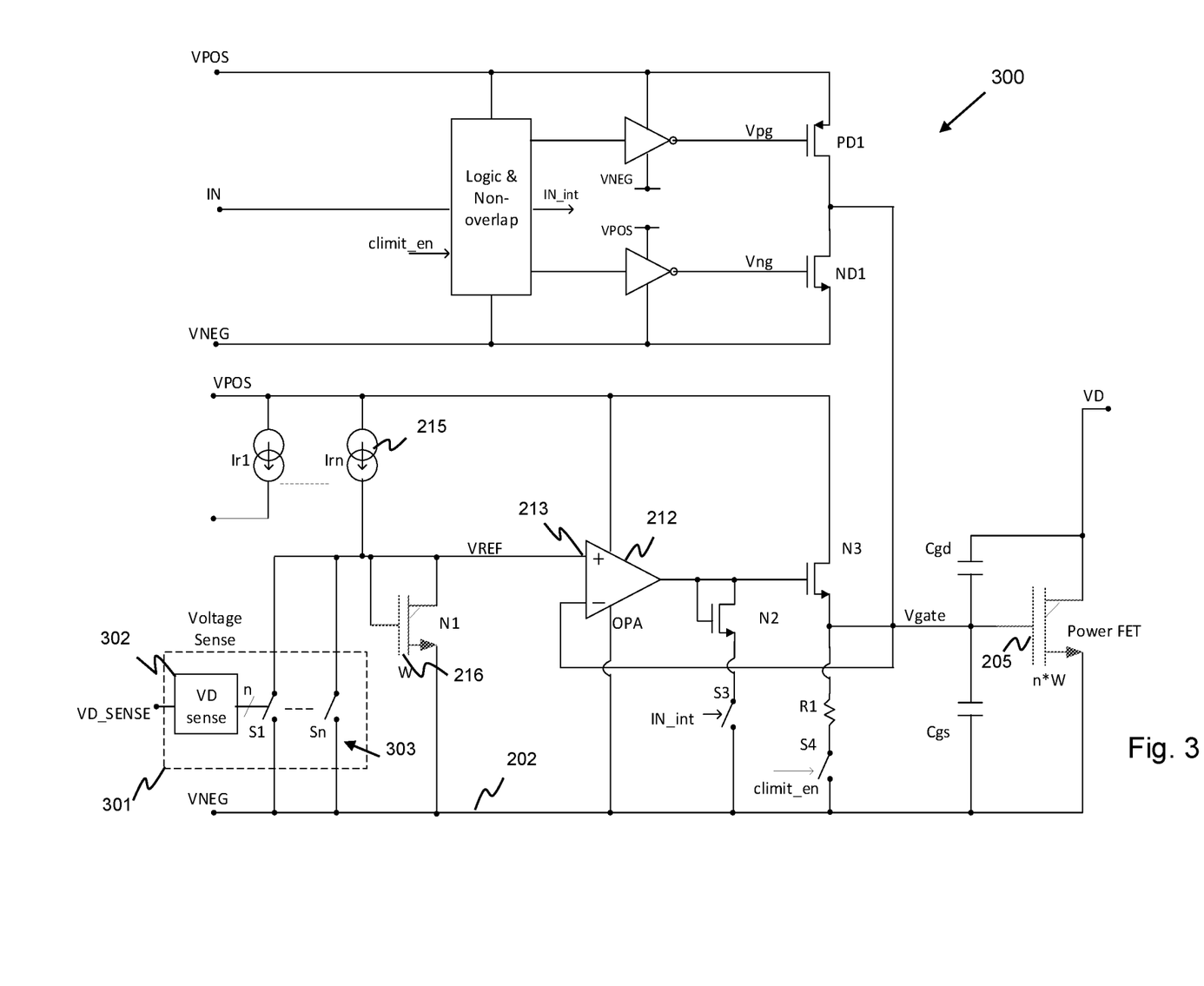
FIG. 3 is a schematic circuit diagram of an alternative gate driver circuit for the switched capacitor converter of FIG. 1.

During the startup mode, the drain voltage of FET 205 varies such that the FET 205 operates in either a linear region at small currents or at saturation with higher currents. Since FET N1 216 is diode-connected and biased by reference current Irn, FET N1 216 will always be operating in the saturation region, which may restrict the ability to limit current through the power FET 205. FIG. 3 illustrates a version of the gate driver circuit 300 similar to that in FIG. 2 but with the addition of a drain voltage sensing circuit 301 that addresses this issue by bypassing some of the current Irn provided by the current source 215. thereby reducing the voltage VREF provided to the first input 213 of the amplifier 212. The other components of the circuit 300 correspond with those in FIG. 2.

The drain voltage sensing circuit 301 is connected between the first input 213 of the amplifier 212 and the VNEG rail 202 and comprises a voltage sensing module 302 and a plurality of switches S1-n 303. Each of the switches S1-n 303 is connected in parallel between the first input 213 of the amplifier 212 and the VNEG rail 202. Operation of each of the switches S1-n 303 is controlled by the voltage sensing module 302. The voltage sensing module 302 is connected to sense the drain voltage VD of the power FET 205 and operates switches 303 according to the level of the voltage VD. As the drain voltage VD rises, the switches are progressively closed to bypass more of the current Irn and lower the voltage VREF provided at the first input 213 of the amplifier 212.

Figure 4:
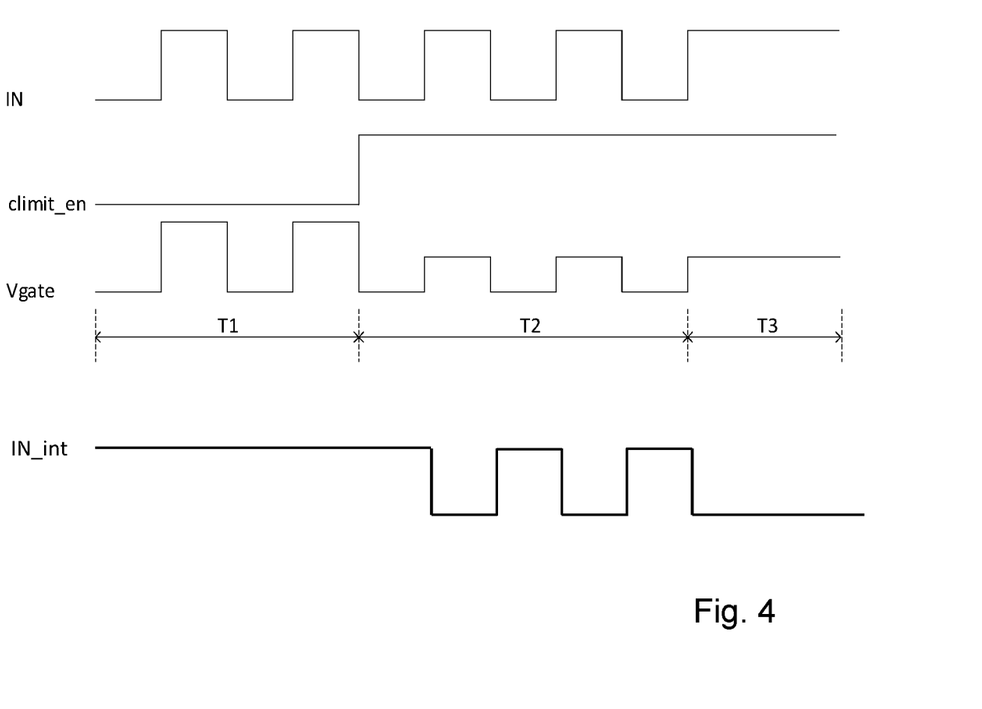
FIG. 4 is a schematic plot of input, limiting and gate voltage signals as a function of time.

FIG. 4 illustrates different operating modes for the gate driver circuit 200 in example time periods T1, T2 and T3. In the first time period T1, corresponding to a normal switching mode, the climit_en signal is low and the output gate voltage signal Vgate switches between its full range in line with the input signal IN, which switches the corresponding power FET. The climit_en signal is low, which disables the current limitation function of the circuit 200. In this mode, FET PD1 208 is switched on and off by the output signal Vpg from inverter 211 and FET ND1 209 is switched on and off by the output signal Vng from inverter 212. Voltage signal VREF and amplifier 212 are disabled and switch S3 220 is closed to disable the source follower N3 221. Switch S4 222 is open to prevent a current path to ground from N3 221. With the signals as shown in FIG. 4, the logical combination provided by the logic circuit 210 is IN_int=NOT(IN) AND NOT (climit_en), i.e. the signal IN_int is only disabled when both IN and climit_en are enabled and is enabled otherwise. As can be seen in FIG. 4, IN_int is enabled whenever climit_en is disabled and, when climit_en is enabled, IN_int is enabled only when IN is disabled. In other words, the internal switching signal IN_int follows the inverse of the input switching signal IN when the current limit signal climit_en is enabled.

In the second and third time periods T2, T3, the climit_en signal is high, causing the current provided by the FET 205 to be limited. In these time periods, switch S3 220 is controlled by the input signal IN, opening when the input signal IN is high and closing when the input signal IN is low. The gate voltage Vgate is reduced in time period T2 to a target value, in this example by around half, and switches between a reduced voltage range in line with the input signal IN. This period T2 corresponds with a limited swing switching period, in which device ND1 209 operates in combination with the second gate switching module 207 during a powering up stage. In time period T3, the input signal is constant and the output gate voltage Vgate is also constant at the reduced high level. This corresponds to a period in which the CFLY capacitor 103 is being pre-charged or another period in which the current needs to be limited in a non-switching mode.

In an implementation of an SCC with current limiting, all gate drivers 101a-d may be configured according to the example gate driver circuit 200 described above. However, since two of the four FETs are switched during each phase of operation, only one of each pair needs to be implemented as a current limiting gate driver so that the current through both is limited during startup. The SCC may therefore comprise two or more of the gate drivers configured according to the example gate driver 200.

From reading the present disclosure, other variations and modifications will be apparent to the skilled person. Such variations and modifications may involve equivalent and other features which are already known in the art of switching capacitor converters, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A switched capacitor converter, SCC, comprising:
   first and second capacitors;
   a plurality of power field effect transistors FETs, connected in a ladder arrangement between an input voltage node and a ground voltage node the plurality of power FETs operable to charge and discharge the first and second capacitors; and
   a plurality of gate driver circuits, a gate of each power FET connected to an output of a respective gate driver circuit, each gate driver circuit connected to first and second supply voltage rails and arranged to provide a gate voltage signal to a respective power FET in response to a respective input switching signal,
   wherein two or more of the gate driver circuits each comprises a first gate driver module and a second gate driver module and is configured to operate in:
   a first mode in which the first gate driver module provides the gate voltage signal to a respective power FET in response to an input switching signal, IN, at an input of the first gate driver module causing the gate voltage signal to switch between the first and second voltage rails by operation of first and second switches connected between the pair of voltage rails; and
   a second mode in which, in response to enabling of a current limit switching signal, climit_en, the first gate driver module disables switching of one of the first and second switches and the second gate driver module operates to limit a current provided to the respective power FET.

2. The SCC of claim 1, wherein the first gate driver module comprises a logic circuit configured to convert the input switching signal to a pair of switching signals provided to respective first and second inverters connected to respectively drive the first and second switches.

3. The SCC of claim 2, wherein the first switch is a p-channel FET and the second switch is an n-channel FET, a node between the first and second switches connected to the gate of the respective power FET.

4. The SCC of claim 3, wherein the second gate driver module comprises an amplifier with a first input connected to a reference voltage circuit and a second input connected to the gate of the respective power FET, the reference voltage circuit comprising a current source in series with a first diode-connected n-channel FET connected between the pair of supply voltage rails, the input of the amplifier connected to a node between the current source and the first diode-connected n-channel FET.

5. The SCC of claim 4, comprising a second diode-connected n-channel FET connected between an output of the amplifier and the second supply voltage rail via a third switch.

6. The SCC of claim 5, wherein the logic circuit is configured to provide an internal switching signal, IN_int, to the third switch to connect the second diode-connected n-channel FET to the second supply voltage rail when IN_int is enabled.

7. The SCC of claim 6, wherein IN_int is a logical combination of IN and climit_en.

8. The SCC of claim 7, wherein IN_int=NOT(IN) AND NOT(climit_en).

9. The SCC of claim 4, wherein the second gate driver module comprises a third n-channel FET having a drain connected to the first supply voltage rail, a gate connected to the output of the amplifier and a source connected to the second voltage supply rail via a resistor and a fourth switch, the fourth switch arranged to close on enabling of the current limit switching signal.

10. The SCC of claim 4, comprising a drain voltage sensing circuit connected between the first input of the amplifier and the second voltage supply rail, the drain voltage sensing circuit comprising a voltage sensing module configured to measure a drain voltage of the respective power FET and a plurality of switches connected in parallel between the first input of the amplifier and the second voltage supply rail, the voltage sensing module configured to progressively close the plurality of switches as the drain voltage rises.

11. The SCC of claim 1, wherein the plurality of power FETs comprise first, second, third and fourth power FETs, wherein:
the first power FET has a source connected to the ground voltage node and a drain connected to a source of the second power FET and to a first terminal of the first capacitor;
the second power FET has a drain connected to an output voltage node and to a source of the third FET;
the third power FET has a drain connected to a source of the fourth FET and to a node connecting a second terminal of the first capacitor and a first terminal of the second capacitor; and
the fourth power FET has a drain connected to a supply voltage node.

12. The SCC of claim 11, wherein the plurality of gate driver circuits comprise first, second, third and fourth gate driver circuits having respective first, second third and fourth switching signal inputs and respective outputs connected to gates of the first, second, third and fourth power FETs.

13. The SCC of claim 12, wherein:
a first voltage rail of the first gate driver circuit is connected to the output voltage node and a second voltage rail of the first gate driver circuit is connected to the ground voltage node;
a first voltage rail of the second gate driver circuit is connected to the node connecting the second terminal of the first capacitor and the first terminal of the second capacitor and a second voltage rail of the second gate driver circuit is connected to the first terminal of the first capacitor;
a first voltage rail of the third gate driver circuit is connected to the input voltage node and a second voltage rail of the third gate driver circuit is connected to the output voltage node; and
a first voltage rail of the fourth gate driver circuit is connected to a second terminal of the second capacitor and a second voltage rail of the fourth gate driver circuit is connected to the node connecting the second terminal of the first capacitor and the first terminal of the second capacitor.

14. A method of operating a switched capacitor converter (SCC), the SCC comprising:
first and second capacitors;
a plurality of power field effect transistors (FETs) connected in a ladder arrangement between an input voltage node and a ground voltage node, the plurality of power FETs operable to charge and discharge the first and second capacitors; and
a plurality of gate driver circuits, a gate of each power FET connected to an output of a respective gate driver circuit, each gate driver circuit connected to first and second supply voltage rails and arranged to provide a gate voltage signal to a respective power FET in response to a respective input switching signal,
wherein two or more of the gate driver circuits each comprises a first gate driver module and a second gate driver module and is configured to operate in:
a first mode in which the first gate driver module provides the gate voltage signal to a respective power FET in response to an input switching signal, IN, at an input of the first gate driver module causing the gate voltage signal to switch between the first and second voltage rails by operation of first and second switches connected between the pair of voltage rails; and
a second mode in which, in response to enabling of a current limit switching signal, climit_en, the first gate driver module disables switching of one of the first and second switches and the second gate driver module operates to limit a current provided to the respective power FET,
the method comprising:
in a first time period, disabling the current limit switching signal and providing the input switching signal to each of the gate driver circuits to generate a gate voltage switching between the first and second voltage rails to each respective power FET; and
in a second time period, enabling the current limit switching signal and providing the input switching signal to each of the gate driver circuits to generate a reduced gate voltage switching to each respective power FET.

15. The method of claim 14, comprising:
in a third time period, enabling the current limit switching signal and providing a constant input signal to each of the gate driver circuits to generate a constant gate voltage to each respective power FET.

16. A gate driver circuit for a switched capacitor converter (SCC), the gate driver circuit connected to first and second supply voltage rails and arranged to provide a gate voltage signal to a power FET in response to an input switching signal, the gate driver circuit comprising a first gate driver module and a second gate driver module and configured to operate in:
a first mode in which the first gate driver module provides the gate voltage signal to the power FET in response to the input switching signal at an input of the first gate driver module causing the gate voltage signal to switch between the first and second voltage rails by operation of first and second switches connected between the pair of voltage rails; and a second mode in which, in response to enabling of a current limit switching signal, climit_en, the first gate driver module disables switching of one of the first and second switches and the second gate driver module operates to limit a current provided to power FET.

17. The gate driver circuit of claim 16, wherein the first gate driver module comprises a logic circuit configured to convert the input switching signal to a pair of switching signals provided to respective first and second inverters connected to respectively drive the first and second switches.

18. The gate driver circuit of claim 17, wherein the first switch is a p-channel FET and the second switch is an n-channel FET, a node between the first and second switches connected to the gate of the power FET.

19. The gate driver circuit of claim 18, wherein the second gate driver module comprises an amplifier with a first input connected to a reference voltage circuit and a second input connected to the gate of the power FET, the reference voltage circuit comprising a current source in series with a first diode-connected n-channel FET connected between the pair of supply voltage rails, the input of the amplifier connected to a node between the current source and the first diode-connected n-channel FET.

20. The gate driver circuit of claim 19, comprising a second diode-connected n-channel FET connected between an output of the amplifier and the second supply voltage rail via a third switch.

* * * * *